United States Patent
Sugiyo et al.

(10) Patent No.: US 8,592,243 B2
(45) Date of Patent: Nov. 26, 2013

(54) METHOD FOR FORMING BUFFER LAYER IN DYE-SENSITIZED SOLAR CELL

(75) Inventors: Takeshi Sugiyo, Osaka (JP); Tetsuya Inoue, Osaka (JP)

(73) Assignee: Hitachi Zosen Corporation, Osaka (JP)

( * ) Notice: Subject to any disclaimer, the term of this patent is extended or adjusted under 35 U.S.C. 154(b) by 0 days.

(21) Appl. No.: 13/519,913

(22) PCT Filed: Dec. 22, 2010

(86) PCT No.: PCT/JP2010/073083
§ 371 (c)(1),
(2), (4) Date: Jun. 29, 2012

(87) PCT Pub. No.: WO2011/083689
PCT Pub. Date: Jul. 14, 2011

(65) Prior Publication Data
US 2012/0288978 A1 Nov. 15, 2012

(30) Foreign Application Priority Data
Jan. 8, 2010 (JP) ................... 2010-002441

(51) Int. Cl.
*H01L 21/00* (2006.01)
(52) U.S. Cl.
USPC ............. 438/57; 438/104; 438/502; 438/795; 257/183.1; 257/184; 257/448; 257/449
(58) Field of Classification Search
USPC ........... 257/43, 535, 636–638, E31.11, 183.1, 257/184, 448–459, 466; 438/85, 104, 722, 438/756, 787, 57, 502, 479, 795, 799; 136/255, 265
See application file for complete search history.

(56) References Cited

U.S. PATENT DOCUMENTS

| | | | |
|---|---|---|---|
| 2006/0163566 A1 | 7/2006 | Kawaraya et al. | 257/43 |
| 2008/0185037 A1* | 8/2008 | Kim et al. | 136/252 |
| 2009/0008637 A1* | 1/2009 | Tiwari et al. | 257/43 |
| 2010/0282308 A1 | 11/2010 | Okamoto | 136/255 |

FOREIGN PATENT DOCUMENTS

| | | |
|---|---|---|
| JP | 2004-111348 | 4/2004 |
| JP | 2004-196644 | 7/2004 |
| JP | 2007-311162 | 11/2007 |
| WO | WO2004/033756 | 4/2004 |
| WO | WO2009/013942 | 1/2009 |

OTHER PUBLICATIONS

International Search Report for International Application No. PCT/JP2010/073083, Mar. 8, 2011.

* cited by examiner

*Primary Examiner* — Mark A Laurenzi
(74) *Attorney, Agent, or Firm* — Kusner & Jaffe

(57) ABSTRACT

A method for forming a buffer layer in a dye-sensitized solar cell including a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method including: forming the buffer layer by sintering a mixed solution of an alcohol solution and 0.03% to 5% by mass of metal alkoxide by laser beam irradiation after applying the mixed solution to the surface of the transparent electrode by spin coating, the transparent electrode being rotated by a rotating table.

6 Claims, 5 Drawing Sheets

METHOD FOR FORMING BUFFER LAYER IN DYE-SENSITIZED SOLAR CELL

TECHNICAL FIELD

The present invention relates to a method for forming a buffer layer in a dye-sensitized solar cell.

BACKGROUND ART

Generally, a dye-sensitized solar cell includes: a transparent electrode including a transparent conductive film formed on a transparent substrate, e.g., a glass plate; a counter electrode including a similar transparent conductive film formed on the surface of a transparent substrate; an iodized electrolyte layer disposed between the electrodes; and a photocatalyst film disposed between the electrodes and on the surface of the transparent electrode. A known photocatalyst film contains a metallic oxide such as titanium oxide ($TiO_2$) and is stained with a photosensitizing dye such as ruthenium.

With this configuration, the transparent electrode and the electrolyte layer are in contact with each other. Thus, a liquid electrolyte may cause leakage of electrons from the transparent electrode to the electrolyte layer, unfortunately leading to a reverse current and lower power generation efficiency.

In order to solve the problem, in a known method for preventing such a reverse current (see Patent Literature 1), a fine film made of semiconductors including titanium oxide and zinc oxide, that is, a so-called buffer layer is formed between a transparent electrode and a photocatalyst film (metallic oxide).

CITATION LIST

Patent Literature
Patent Literature 1: Japanese Patent Laid-Open No. 2007-311162

SUMMARY OF INVENTION

Technical Problem

In the configuration of Patent Literature 1, the formation of a semiconductor film requires sintering at a high temperature, e.g., about 500° C. Thus, a lightweight and inexpensive synthetic resin cannot be used for the substrate of the transparent electrode.

A method for forming a buffer layer at a low temperature is disclosed but unfortunately requires a large and expensive apparatus because the method uses sputtering and vacuum deposition.

An object of the present invention is to provide a method for forming a buffer layer in a dye-sensitized solar cell in which a substrate can be made of a heat-sensitive material, e.g., a synthetic resin.

Solution to Problem

In order to solve the problem, a first aspect of the present invention is a method for forming a buffer layer in a dye-sensitized solar cell including a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method including: forming the buffer layer by sintering a mixed solution of an alcohol solution and 0.03% to 5% by mass of metal alkoxide by laser beam irradiation when or after applying the mixed solution to the surface of the rotated transparent electrode by spin coating, wherein gas is blown to the transparent electrode.

A second aspect of the present invention is a method for forming a buffer layer in a dye-sensitized solar cell including a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method including: forming the buffer layer by sintering a mixed solution of an alcohol solution and 0.03% to 5% by mass of metal alkoxide by laser beam irradiation when or after applying the mixed solution to the surface of the rotated transparent electrode by electrostatic spraying or spraying.

A third aspect of the present invention is a method according to each of the above methods for forming the buffer layer, wherein in an atmosphere of nitrogen gas, the mixed solution of an alcohol solution and 0.03% to 5% by mass of metal alkoxide is applied to the surface of the transparent electrode or a coating of the mixed solution is sintered by laser beam irradiation.

A fourth aspect of the present invention is a method according to each of the above methods for forming the buffer layer, wherein water is sprayed in laser beam irradiation.

Advantageous Effects of Invention

According to the methods for forming the buffer layer, in the formation of the buffer layer on the transparent electrode, a coating of a mixed solution of an alcohol solution and 0.03% to 5% by mass of metal alkoxide is instantly sintered by laser beam irradiation when or after the mixed solution is applied to the surface of the transparent electrode. In other words, it is not necessary to heat the overall electrode. Thus, the substrate of the transparent electrode may be made of a heat-sensitive material such as a synthetic resin, reducing the weight and cost of a solar cell. Since it is not necessary to heat the overall substrate, the need for a large heater is eliminated, reducing the cost of production equipment.

In an atmosphere of reducing gas, the mixed solution of an alcohol solution and 0.03% to 5% by mass of metal alkoxide is applied to the surface of the transparent electrode or the coating of the mixed solution is sintered by laser beam irradiation, thereby improving the electric characteristics (conductivity) of the buffer layer and power generation efficiency.

DESCRIPTION OF EMBODIMENTS

[First Embodiment]

A method for forming a buffer layer in a dye-sensitized solar cell according to a first embodiment of the present invention will be described below with reference to the accompanying drawings.

Figure 1:
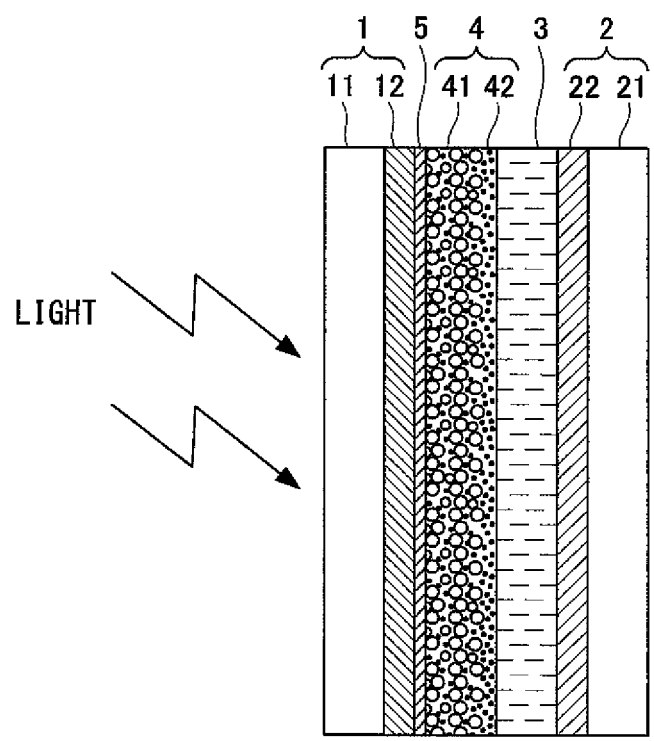
FIG. 1 is a cross-sectional view illustrating a basic configuration of a dye-sensitized solar cell according to a first embodiment of the present invention.

Referring to FIG. 1, the configuration of the dye-sensitized solar cell will be first schematically described below according to the first embodiment.

As illustrated in FIG. 1, the dye-sensitized solar cell includes a transparent electrode 1 serving as a negative electrode, a counter electrode 2 serving as a positive electrode, an electrolyte layer 3 disposed between the electrodes 1 and 2, and a photocatalyst film (also called a photocatalyst layer) 4 disposed between the electrodes 1 and 2 and near the transparent electrode 1. Moreover, a buffer layer 5 is interposed between the transparent electrode 1 and the photocatalyst film 4 to prevent a reverse electron flow. The buffer layer 5 is made of materials such as titanium oxide and zinc oxide and has a thickness of several nm to several tens nm.

The transparent electrode 1 includes a transparent substrate 11 and a transparent conductive film 12 formed on a surface of the transparent substrate 11. The counter electrode 2 includes a transparent substrate 21 and a transparent conductive film 22 formed on a surface of the transparent substrate 21.

The transparent substrates 11 and 21 may be, for example, synthetic resin plates or glass plates. In view of a reduction in weight and cost, a film of a thermoplastic resin such as polyethylene naphthalate (PEN) is preferable. Furthermore, materials including polyethylene terephthalate, polyester, polycarbonate, polyolefin can be used in addition to polyethylene naphthalate.

The transparent conductive films 12 and 22 are preferably made of indium tin oxide (ITO). Moreover, the transparent conductive films 12 and 22 may be thin films containing conductive metallic oxides such as fluorine-doped tin oxide (FTO), tin oxide ($SnO_2$), indium zinc oxide (IZO), and zinc oxide (ZnO).

The electrolyte layer 3 is, for example, an iodine electrolyte solution. Specifically, electrolyte components such as iodine, an iodide ion, and t-butylpyridine are dissolved in an organic solvent containing, for example, ethylene carbonate and methoxyacetonitrile. The electrolyte layer 3 is not limited to an electrolyte solution and may be a solid electrolyte.

The solid electrolyte is, for example, DMPImI (dimethylpropyl imidazolium iodide). Furthermore, the solid electrolyte may be metallic iodides including LiI, NaI, KI, CsI, and $CaI_2$, a combination of $I_2$ and an iodide, e.g., an iodine salt of quaternary ammonium compounds such as tetraalkylammonium iodide, metal bromides including LiBr, NaBr, KBr, CsBr, and $CaBr_2$, and a combination of $Br_2$ and a bromide, e.g., a bromide salt of quaternary ammonium compounds such as tetraalkylammonium bromide.

The photocatalyst film 4 includes an oxide semiconductor layer 41 containing adsorbed photosensitizing dyes 42. The photocatalyst film 4 is produced by applying paste containing oxide semiconductors, which are photocatalyst fine particles, to the surface of the transparent electrode 1, drying the paste, and then adsorbing the photosensitizing dyes onto the oxide semiconductors.

The oxide semiconductors are metallic oxides including titanium oxide ($TiO_2$), tin oxide ($SnO_2$), tungsten oxide ($WO_3$), zinc oxide (ZnO), and niobium oxide ($Nb_2O_5$). The photosensitizing dyes are ruthenium complexes or iron complexes containing ligands having bipyridine structures or terpyridine structures, metal complexes of porphyrin and phthalocyanine, or organic dyes such as eosin, rhodamine, merocyanine, and coumarin.

The counter electrode 2 includes the transparent conductive film 22 formed on the surface of the transparent substrate 21. The counter electrode 2 may be a metal sheet made of, for example, aluminum, copper, and tin. Additionally, the counter electrode may include a gel solid electrolyte held on a mesh electrode that is made of carbon or metals such as aluminum, copper, and tin. The counter electrode 2 may be configured such that one surface of the transparent substrate 21 is covered with the transparent conductive film 22 via a conductive adhesive layer and separately formed brush-like carbon nanotubes are transferred to the transparent substrate 21 through the adhesive layer.

A method for forming the buffer layer 5 on the surface of the transparent electrode 1 will be discussed below.

Figure 2:
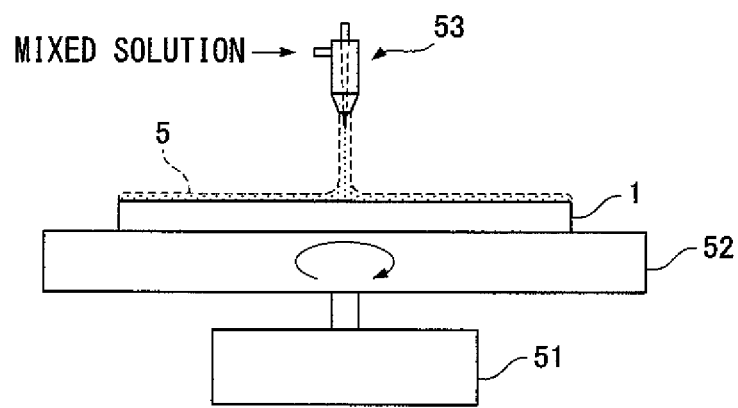
FIG. 2 is a side view illustrating an example of a method for forming a buffer layer according to the first embodiment.

As illustrated in FIG. 2, the transparent electrode 1 is first placed on, for example, a rotating table 52 rotated by an electric motor 51. The rotating table 52 is then rotated by the electric motor 51, rotating the transparent electrode 1 in a horizontal plane at a predetermined rotation speed. After that, a mixed solution of an alcohol solution and 0.03% to 5% by mass of metal alkoxide is supplied to the center of a surface of the rotating transparent electrode 1 (precisely, a surface of the transparent conductive film) from a liquid feed nozzle 53 to form a thin film (hereinafter, will be called a coating) by spin coating. The rotation speed of the transparent electrode 1 ranges from 50 rpm to 5000 rpm and the rotation time of the transparent electrode 1 ranges from 5 seconds to 300 seconds.

After the formation of the coating, the surface of the transparent electrode 1 is sintered by laser beam irradiation, forming the buffer layer 5.

The transparent electrode 1 is instantly sintered by a laser beam in the formation of the buffer layer 5, thereby preventing the overall transparent electrode 1 from rising in temperature. In other words, the overall substrate is not heated and thus may be made of heat-sensitive materials such as a synthetic resin (plastic).

The following will describe a method for forming the photocatalyst film 4 on the surface of the transparent electrode 1, to be precise, on the surface of the buffer layer 5.

Specifically, a mixed solution of titanium oxide serving as photocatalyst fine particles and a solution of metal alkoxide (titanium alkoxide) serving as a precursor of titanium oxide is evenly sprayed onto the surface of the buffer layer 5 to form a coating and then the coating is sintered by laser beam irradiation (from the spraying surface) to form the oxide semiconductor layer 41. The oxide semiconductor layer 41 is dipped into an immersion liquid containing the photosensitizing dyes 42 to adsorb the dyes and then the oxide semiconductor layer 41 is dried. Preferably, the oxide semiconductor layer 41 is burned after that. The photosensitizing dyes may be, for example, ruthenium complexes or iron complexes containing ligands having bipyridine structures or terpyridine structures, metal complexes of porphyrin and phthalocyanine, or organic dyes such as eosin, rhodamine, merocyanine, and coumarin.

In this explanation, the mixed solution of titanium oxide serving as photocatalyst fine particles and the precursor of titanium oxide is applied. The mixed solution may contain photocatalyst fine particles, a solvent (e.g., an alcohol solution), and a thickener or the like, or contain photocatalyst fine particles, a lower alcohol, and a small amount of water. Moreover, the mixed solution may contain photocatalyst fine particles, polyethylene glycol, and distilled water or an acid aqueous solution.

The photocatalyst film 4 is also formed by instant sintering with a laser beam. Thus, as in the formation of the buffer layer, the overall transparent electrode 1 is prevented from rising in temperature.

Figure 3:
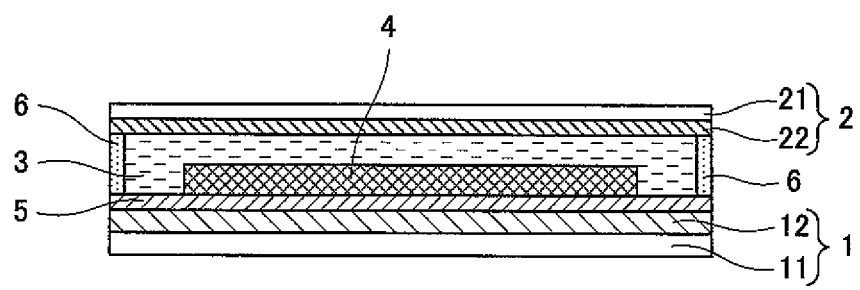
FIG. 3 is a cross-sectional view schematically illustrating a method for manufacturing the dye-sensitized solar cell according to the first embodiment.

Referring to FIG. 3, an assembly operation for the dye-sensitized solar cell will be schematically described below. First, as has been discussed, the mixed solution of the alcohol solution and 0.03% to 5% by mass of metal alkoxide is supplied to the surface of the transparent electrode 1 to form a coating by spin coating. The surface of the transparent electrode 1 is then sintered by laser beam irradiation to form the buffer layer 5. The photocatalyst film 4 is then formed on the buffer layer 5 on the surface of the transparent electrode 1. The transparent electrode 1 having the photocatalyst film 4 and the counter electrode 2 are aligned with each other and then a space between the electrodes 1 and 2 is sealed with a sealer 6, e.g., a thermal adhesive film. The electrolyte layer 3 may be formed by injecting a liquid electrolyte into the space between the electrodes 1 and 2 from a hole or a gap in advance formed on the transparent electrode 1 or the counter electrode 2.

In the case of a solid electrolyte, the outer edges of the electrodes 1 and 2 may be thermally bonded to each other after the electrodes 1 and 2 are stacked with the photocatalyst film 4 and the electrolyte layer 3 interposed between the electrodes 1 and 2. The electrodes 1 and 2 may be heated by dies or irradiation of energy beams, e.g., plasma (long wavelength), microwaves, visible light (at least 600 nm), and infrared rays.

In this explanation, the coating is formed on the surface of the transparent electrode and then is irradiated with a laser beam. Alternatively, the mixed solution being applied may be irradiated with a laser beam.

According to the method for forming the buffer layer, in the formation of the buffer layer on the surface of the transparent electrode, the mixed solution of the alcohol solution and 0.03% to 5% by mass of metal alkoxide is applied to the surface of the transparent electrode. After or during the application, the coating is irradiated with a laser beam and is instantly sintered. In other words, it is not necessary to heat the overall electrode. Thus, the substrate of the transparent electrode may be made of a heat-sensitive material such as a synthetic resin, reducing the weight and cost of a solar cell. Since it is not necessary to heat the overall substrate, the need for a large heater is eliminated, reducing the cost of production equipment.

FIRST EXAMPLE

A method for forming the buffer layer in the dye-sensitized solar cell will be discussed according to a first example, which will more specifically describe the first embodiment.

In the first example, first, a mixed solution of an alcohol solution and metal alkoxide was applied with a predetermined thickness on a commercial PEN-ITO film by spin coating.

The mixed solution to be applied (hereinafter, will be also called an applied solution) is obtained by dissolving 0.20 g of titanium (IV) isopropoxide (TTIP) in 37.50 g of propanol.

In the spin coating, an electrode was initially rotated at 500 rpm for five minutes and was finally rotated at 4000 rpm for 60 seconds. Thus, a coating having a thickness of about 5 nm was obtained. The coating was then sintered by laser beam irradiation to obtain the buffer layer.

The materials of the applied solution are not limited. For example, titanium tetraethoxide, titanium tetrachloride, and titanium hydroxide are usable.

A metal species in metal alkoxide is not limited to titanium oxide. For example, zinc oxide, niobium oxide, and tungsten oxide are usable.

The alcohol for dissolving metal alkoxide is not limited to propanol. For example, tert-butyl alcohol, ethoxyethanol, and ethanol are usable.

The mixed solution left in the atmosphere naturally accelerates hydrolysis. Thus, diethanolamine or acetylacetone for suppressing hydrolysis may be added to keep stable performance.

A used laser beam will be discussed below.

Laser beams from the visible region to the near infrared region (700 nm to 1100 nm) are usable. Specifically, a Nd:YAG laser (1064 nm) and a Nd:YVO4 laser (1064 nm) or wavelength tunable lasers such as a titanium sapphire laser (650 nm to 1100 nm), a Cr:LiSAF laser (780 nm to 1010 nm), and an alexandrite laser (700 nm to 820 nm) may be used.

An irradiator (not shown) for the laser beam includes a galvano scanner and can freely change a laser irradiation position.

SECOND EXAMPLE

A method for forming the buffer layer in the dye-sensitized solar cell according to a second example will be described below.

Figure 4:
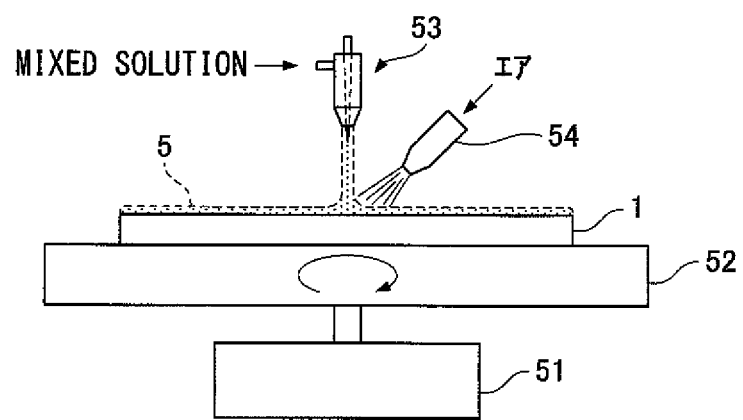
FIG. 4 is a side view illustrating an example of a method for forming the buffer layer according to the first embodiment.

The buffer layer of the second example is formed by spin coating as in the first example. As illustrated in FIG. 4, air is blown as gas to the surface of the transparent electrode 1 from a gas supply nozzle 54. Specifically, blowing air moves sequentially from the center of rotation to the outer edge of the transparent electrode 1. The blowing air can prevent an applied solution from being retained around the transparent electrode 1. Moreover, even in the case where the transparent electrode has a rough surface (particularly, a synthetic resin plate), a mixed solution can be thinly and evenly applied, achieving a small and even thickness over the buffer layer 5. The gas is not limited to air as long as the gas does not react with the mixed solution to be applied.

The applied film may be then irradiated with a laser beam to sinter metal alkoxide, forming the buffer layer.

The 6-mm square dye-sensitized solar cell having a thickness of several μm was produced using the transparent electrode on which the buffer layer had been formed by the method of the example. As a result of measurements of power conversion efficiency with an AM of 1.5 and standard light source irradiation of 100 mW/cm$^2$, in the absence of the buffer layer, the dye-sensitized solar cell had a current density of 5.64 mA/cm$^2$, an open-circuit voltage of 0.71 V, a fill factor of 0.69, and conversion efficiency of 2.77%. In the presence of the buffer layer and the absence of laser beam irradiation, the dye-sensitized solar cell had a current density of 7.18 mA/cm$^2$, an open-circuit voltage of 0.74 V, a fill factor of 0.60, and conversion efficiency of 3.23%. In the presence of the buffer layer and laser beam irradiation, the dye-sensitized solar cell had a current density of 7.82 mA/cm$^2$, an open-circuit voltage of 0.75 V, a fill factor of 0.69, and conversion efficiency of 3.93%.

[Second Embodiment]

Figure 5:
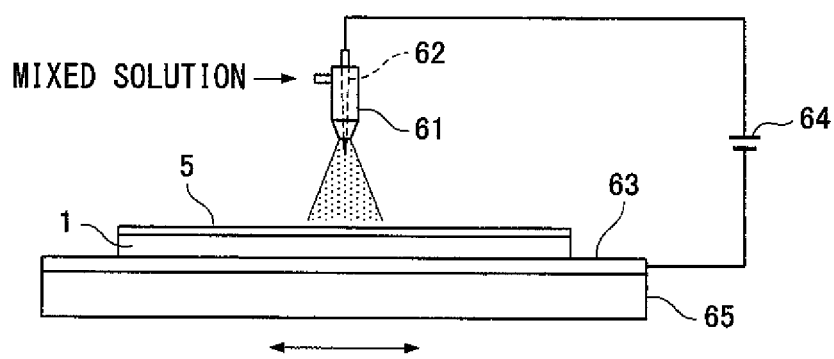
FIG. 5 is a side view illustrating a method for forming a buffer layer according to a second embodiment of the present invention.

Referring to FIG. 5, the following will describe a method for forming a buffer layer in a dye-sensitized solar cell according to a second embodiment of the present invention.

In the method for forming the buffer layer according to the first embodiment, the mixed solution is applied to the surface of the transparent electrode by spin coating, whereas in the method for forming the buffer layer according to the second embodiment, electrostatic spraying is used. Thus, the same components as in the first embodiment will be simply described with the same reference numerals.

As illustrated in FIG. 5, in the electrostatic spraying method, a needle electrode 62 is disposed at the center of a spray nozzle 61 that sprays a solution to a transparent electrode 1, a direct-current power supply 64 having a predetermined voltage is connected between the needle electrode 62 and an application electrode 63 on which the transparent electrode 1 is placed, a positive voltage is applied to the needle electrode 62 during spraying to electrically charge a spray liquid, and the liquid is sprayed and attached to a surface of the transparent electrode 1 placed on the negative application electrode 63. The transparent electrode 1 is placed on a horizontally moving device 65 and can move to any position.

In the second embodiment, a mixed solution of metal alkoxide and an alcohol solution is applied to a commercial PEN-ITO film by electrostatic spraying such that the mixed solution has a predetermined thickness. The mixed solution to be applied is obtained by dissolving 0.05 g of titanium (IV) isopropoxide (TTIP) in 99.95 g of propanol.

The application conditions of electrostatic spraying include the type of spray nozzle, the viscosity of the applied solution, an atomization air pressure, a pattern width, a discharge amount, a discharge pressure, the travel speed of the nozzle, the width of deposition, a distance between the spray nozzle and the transparent electrode, and an applied voltage. These conditions vary among used devices and thus are optionally selected to have a desired thickness.

In the second embodiment, for example, a two-fluid spray nozzle was used. The spray nozzle had an atomization air pressure of 0.2 MPa, a discharge amount of 10 g/min, a distance of 20 cm from the transparent electrode to the spray nozzle, an applied voltage of 20 kV, and a travel speed of the spray nozzle of 300 mimin.

After a coating was formed by spraying, the coating was sintered by laser beam irradiation, forming a buffer layer 5 having a thickness of about 6 nm to 7 nm.

The 6-mm square dye-sensitized solar cell having a thickness of several μm was produced using the transparent electrode on which the buffer layer had been formed by the method of the second embodiment. As a result of measurements of power conversion efficiency with an AM of 1.5 and standard light source irradiation of 100 mW/cm$^2$, the dye-sensitized solar cell had a current density of 7.27 mA/cm$^2$, an open-circuit voltage of 0.76 V, a fill factor of 0.74, and conversion efficiency of 3.960. In the absence of the buffer layer, the same result is obtained as in the second example of the first embodiment.

In the second embodiment, electrostatic spraying is used. The mixed solution may be applied by simple spraying instead of electrostatic spraying.

In the foregoing embodiments, the mixed solution applied to the surface of the transparent electrode is sintered by laser beam irradiation in the formation of the buffer layer. The mixed solution may be irradiated with a laser beam during application. This allows the solution to be applied, dried, and sintered at the same time and facilitates the crystallization of titanium oxide.

The method for forming the buffer layer according to the second embodiment will be briefly described below.

The method for forming the buffer layer is a method for forming a buffer layer in a dye-sensitized solar cell including a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method including: forming the buffer layer by sintering a mixed solution of an alcohol solution and 0.03% to 5% by mass of metal alkoxide by laser beam irradiation when or after applying the mixed solution to the surface of the transparent electrode by spraying or electrostatic coating, the transparent electrode being movable to any position by a horizontally moving device.

In this explanation, the transparent electrode can be moved to any position by the horizontally moving device. The transparent electrode may be placed and rotated on a rotating table that is rotated by an electric motor.

In this method, during sintering by a laser beam, water may be sprayed from a different spray nozzle to the surface of the buffer layer formed by electrostatic spraying and a sprayed point may be irradiated with a laser beam.

According to the method for forming the buffer layer, in the absence of the buffer layer, the dye-sensitized solar cell had a current density of 6.64 mA/cm$^2$, an open-circuit voltage of 0.71 V, a fill factor of 0.69, and conversion efficiency of 2.77%, whereas, in the presence of the buffer layer, the dye-sensitized solar cell had a current density of 6.45 mA/cm$^2$, an open-circuit voltage of 0.72 V, a fill factor of 0.72, and conversion efficiency of 3.34%.

This accelerates the hydrolysis of a mixed solution of photocatalyst fine particles and the precursor (metal alkoxide) of the particles and increases the crystallinity of the buffer layer, thereby improving power generation efficiency.

[Third Embodiment]

A method for forming a buffer layer in a dye-sensitized solar cell according to a third embodiment of the present invention will be described below.

In the method for forming the buffer layer according to the foregoing embodiments, the mixed solution is applied to the surface of the transparent electrode by spin coating or electrostatic spraying. In the method for forming the buffer layer according to the third embodiment, reducing gas such as nitrogen gas and argon gas that do not react with the buffer layer is sprayed onto a surface of a transparent electrode during the formation of the buffer layer, that is, during the application of a mixed solution, or during sintering by laser beam irradiation. Alternatively, the transparent electrode is placed in an atmosphere of reducing gas.

As has been discussed, the mixed solution is applied in an atmosphere of reducing gas. Generally, a buffer layer sintered in the atmosphere by a laser forms an oxide film (e.g., a TiO$_2$ film), whereas the buffer layer in an atmosphere of reducing gas has excellent electric characteristics (conductivity) in the presence of a composite film such as a TiO or TiO, film, improving power generation efficiency. The same effect can be obtained by laser sintering in an atmosphere of reducing gas after the application of the mixed solution.

In the third embodiment, the mixed solution of metal alkoxide and an alcohol solution is applied to a commercial PEN-ITO film by electrostatic spraying such that the mixed solution has a predetermined thickness. The mixed solution to be applied is obtained by dissolving 0.03 g of titanium (IV) isopropoxide (TTIP) in 99.95 g of propanol.

The 6-mm square dye-sensitized solar cell having a thickness of several μm was produced using the buffer layer formed in this method. As a result of measurements of power conversion efficiency with an AM of 1.5 and standard light source irradiation of 100 mW/cm$^2$, the dye-sensitized solar cell had a current density of 8.51 mA/cm$^2$, an open-circuit voltage of 0.71 V, a fill factor of 0.66, and conversion efficiency of 4.03%. In the absence of the buffer layer, the same result is obtained as in the second example of the first embodiment.

The method for forming the buffer layer according to the third embodiment will be briefly described below.

The method for forming the buffer layer is a method for forming a buffer layer in a dye-sensitized solar cell including a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method including: forming the buffer layer by sintering a mixed solution of an alcohol solution and 0.03% to 5% by mass of metal alkoxide by laser beam irradiation when or after applying the mixed solution to the surface of the transparent electrode by spraying or electrostatic coating, the transparent electrode being movable to any position by a horizontally moving device, wherein in an atmosphere of nitrogen gas, the mixed solution is applied to the surface of the transparent electrode or a coating of the mixed solution is sintered by laser beam irradiation.

In this explanation, the transparent electrode is movable to any position by the horizontally moving device. The transparent electrode may be placed and rotated on a rotating table that is rotated by an electric motor.

The invention claimed is:

1. A method for forming a buffer layer in a dye-sensitized solar cell comprising a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method comprising:
forming the buffer layer by sintering a mixed solution of an alcohol solution and 0.03% to 5% by mass of metal alkoxide by laser beam irradiation when or after applying the mixed solution to a surface of the rotated transparent electrode by spin coating.

2. The method for forming a buffer later in a dye-sensitized solar cell according to claim 1, wherein gas is blown to the transparent electrode from a gas supply nozzle.

3. A method for forming a buffer layer in a dye-sensitized solar cell comprising a transparent electrode, a counter electrode, an electrolyte layer disposed between the electrodes, and a photocatalyst film disposed between the electrodes and near the transparent electrode, the buffer layer being disposed between the transparent electrode and photocatalyst film, the method comprising:
forming the buffer layer by sintering a mixed solution of an alcohol solution and 0.03% to 5% by mass of metal alkoxide by laser beam irradiation when or after applying the mixed solution to a surface of the rotated transparent electrode by electrostatic spraying or spraying.

4. The method for forming a buffer layer in a dye-sensitized solar cell according to one of claims 1 and 3, wherein in an atmosphere of nitrogen gas, the mixed solution of the alcohol solution and 0.03% to 5% by mass of metal alkoxide is applied to the surface of the transparent electrode or a coating of the mixed solution is sintered by laser beam irradiation.

5. The method for forming a buffer layer in a dye-sensitized solar cell according to one of claims 1 and 3, wherein water is sprayed when a coating is sintered by laser beam irradiation.

6. The method for forming a buffer layer in a dye-sensitized solar cell according to claim 4, wherein water is sprayed when a coating is sintered by laser beam irradiation.

* * * * *